(12) United States Patent
Franke

(10) Patent No.: US 8,957,668 B2
(45) Date of Patent: Feb. 17, 2015

(54) INTEGRATED CURRENT SENSOR

(75) Inventor: Joerg Franke, Freiburg (DE)

(73) Assignee: Micronas GmbH, Freiburg (DE)

( * ) Notice: Subject to any disclaimer, the term of this patent is extended or adjusted under 35 U.S.C. 154(b) by 149 days.

(21) Appl. No.: 13/548,824

(22) Filed: Jul. 13, 2012

(65) Prior Publication Data

US 2013/0015839 A1  Jan. 17, 2013

(30) Foreign Application Priority Data

Jul. 13, 2011 (DE) .......................... 10 2011 107 703

(51) Int. Cl.
*G01R 33/07* (2006.01)
*G01R 19/00* (2006.01)

(52) U.S. Cl.
USPC .................................... 324/117 H; 324/76.11

(58) Field of Classification Search
CPC ...... G01R 15/20; G01R 15/202; G01R 19/00; G01R 19/0092
USPC ...................................................... 324/117 H
See application file for complete search history.

(56) References Cited

U.S. PATENT DOCUMENTS

| 5,717,326 A | 2/1998 | Moriwaki |
| 5,883,567 A * | 3/1999 | Mullins, Jr. ................. 338/32 H |
| 5,942,895 A * | 8/1999 | Popovic et al. ............... 324/251 |
| 6,356,068 B1 | 3/2002 | Steiner et al. |
| 6,545,462 B2 | 4/2003 | Schott et al. |
| 7,709,754 B2 * | 5/2010 | Doogue et al. ................ 174/528 |
| 2011/0057650 A1 | 3/2011 | Hellwig et al. |

FOREIGN PATENT DOCUMENTS

| DE | 299 091 A5 | 3/1992 |
| DE | 698 34 043 T2 | 11/2006 |
| DE | 10 2009 029 209 A1 | 3/2011 |
| DE | 10 2009 047 235 A1 | 6/2011 |
| EP | 1 182 461 A2 | 2/2002 |
| WO | WO 2006/037695 A1 | 4/2006 |

* cited by examiner

*Primary Examiner* — Harshad R Patel
(74) *Attorney, Agent, or Firm* — Muncy, Geissler, Olds & Lowe, P.C.

(57) ABSTRACT

An integrated current sensor is provided, having a semiconductor body arranged on a metal substrate, having a first surface with a passivation layer embodied on the first surface and a magnetic field concentrator embodied in a flat manner under the semiconductor body, a first Hall-effect sensor embodied under the passivation layer in the semiconductor body, a second Hall-effect sensor embodied under the passivation layer in the semiconductor body, wherein a first conductor is provided embodied on the first surface between the first Hall-effect sensor and the second Hall-effect sensor, and the magnetic field concentrator is embodied under the first Hall-effect sensor and under the second Hall-effect sensor and under the first conductor.

13 Claims, 3 Drawing Sheets

INTEGRATED CURRENT SENSOR

This nonprovisional application claims priority under 35 U.S.C. §119(a) to German Patent Application No. DE 10 2011 107 703.4, which was filed in Germany on Jul. 13, 2011, and which is herein incorporated by reference.

BACKGROUND OF THE INVENTION

1. Field of the Invention

The invention relates to an integrated current sensor.

2. Description of the Background Art

From WO 2006 037 695 A1, EP 1 182 461 B1 (which corresponds to U.S. Pat. No. 6,545,462) and DE 10 2009 029 209 A1 (which corresponds to US 2011/0057650), magnetic field sensors and or current sensors are known. In particular in WO 2006 037 695 A1 a substrate with a bearing semiconductor body with two magnetic field sensors and a magnetic field concentrator arranged under the substrate are disclosed.

SUMMARY OF THE INVENTION

It is therefore an object of the invention to provide a device that further develops the prior art.

According to an embodiment of the invention, an integrated current sensor is provided, having a semiconductor body arranged on a metal substrate, having a first surface with a passivation layer embodied on the first surface and a magnetic field concentrator embodied in a flat manner under the semiconductor body, a first Hall-effect sensor embodied under the passivation layer in the semiconductor body, a second Hall-effect sensor embodied under the passivation layer in the semiconductor body, wherein a first conductor is provided embodied on the first surface between the first Hall-effect sensor and the second Hall-effect sensor, and the magnetic field concentrator is embodied under the first Hall-effect sensor and under the second Hall-effect sensor and under the first conductor.

An advantage of the device according to the invention is that, due to the arrangement according to the invention, a part of the magnetic field of the first conductor above the semiconductor surface, if the conductor is current-carrying, in connection with the magnetic field concentrator under the metal substrate, wherein the magnetic field concentrator is embodied of a ferromagnetic material, preferably of soft iron or a Mu metal as a plate or as a film, the magnetic flux density is considerably increased due to the Hall-effect sensors.

In other words, the two Hall-effect sensors are preferably arranged directly above the edge of the magnetic field sensor. At the edge, the flux lines exit in a bundled manner. Naturally, the magnetic field concentrator is to be embodied such that a maximum concentration effect is achieved with respect to the magnetic field lines. To this end the magnetic field concentrator should almost completely cover both Hall-effect sensors, i.e., the length and the width of the magnetic field concentrator are to be selected in a suitable manner. Tests by the applicant have shown that the sensitivity of the current sensor can be substantially increased hereby. In particular with low currents in the first conductor, preferably less than one mA, a Hall voltage can be detected.

In a further embodiment, the first Hall-effect sensor can be arranged at least in part under a first metal surface embodied in an opening of the passivation layer and the second Hall effect sensor is arranged at least in part under a second metal surface embodied in an opening in the passivation layer. In another further development, the first metal surface and the second metal surface are connected to a ferromagnetic first wire embodied above the passivation layer, and the first conductor is guided through under the first wire at a predetermined distance. Furthermore, the wire forms an arc embodied in particular in a circular manner. Moreover, according to a preferred embodiment, the magnetic field concentrator is arranged under the metal substrate in a flat manner.

A advantage of the embodiment is that, due to the arrangement according to the invention, a part of the magnetic field of the first conductor is concentrated above the semiconductor surface, if the conductor is current-carrying, by means of the ferromagnetic first wire. In connection with the magnetic field concentrator under the semiconductor body, wherein the magnetic field concentrator is embodied of a ferromagnetic material preferably as a plate or as a film, the magnetic flux density for the first Hall-effect sensor lying under the first metal surface and for the second Hall-effect sensor lying under the second metal surface is substantially increased. In other words, the first Hall-effect sensor and the second Hall-effect sensor are arranged in the gap, preferably lying opposite both, between the two magnetic field concentration devices, i.e., the magnetic field concentrator and the first wire, which preferably is composed of soft iron or a Mu metal. The sensitivity of the ammeter can be further increased hereby compared to the embodiment without the ferromagnetic wire. In a particularly advantageous further development, the first Hall-effect sensor and the second Hall-effect sensor are respectively embodied exclusively under the assigned metal surface.

In another embodiment, the first wire is embodied as a so-called bond wire and has a first bond on the first metal surface and a second bond on the second metal surface. The ferromagnetic wire can hereby be applied in a cost-effective manner by means of a standard bonding method during the bonding.

In an embodiment, the first conductor, which is preferably embodied as a conductor path under the passivation layer, has a first connection surface embodied at a first head end and a second connection surface embodied at a second head end. The first conductor can hereby be connected preferably by means of a bond wire to the metal substrate. Because the metal substrate, generally also referred to as a lead frame, has pins, a current can be applied to the first conductor via the pins by means of an external current source.

In an alternative embodiment, the first conductor is embodied as a conductor path on the passivation layer and connected to the passivation layer by adhesive force. Preferably, the conductor has metallic formations on the respective head end, with which formations in a packaged state a connection with an external current source is carried out.

In another embodiment, the semiconductor body has an integrated circuit wherein the integrated circuit is in an electrical active connection with the Hall-effect sensors and or the first conductor. With the integrated circuit a current can be injected into the first conductor and the current strength can be reliably determined.

According to an embodiment, a third metal surface with a third Hall-effect sensor and a fourth metal surface with a fourth Hall-effect sensor is provided, wherein the third metal surface is connected to the fourth metal surface by means of a second ferromagnetic wire and the first conductor is guided through under the second wire.

Tests by the applicant have shown that it is advantageous to connect the magnetic field concentrator to the metal substrate by adhesive force. In a further development, the magnetic field concentrator is embodied in a one-part manner and covers the Hall-effect sensors at least in part. In another embodiment, the semiconductor body and the magnetic field concentrator are arranged in a single common housing. The housing is preferably produced in a mold process. All of the parts of the ammeter can herewith be joined in a cost-effective and reliable manner.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
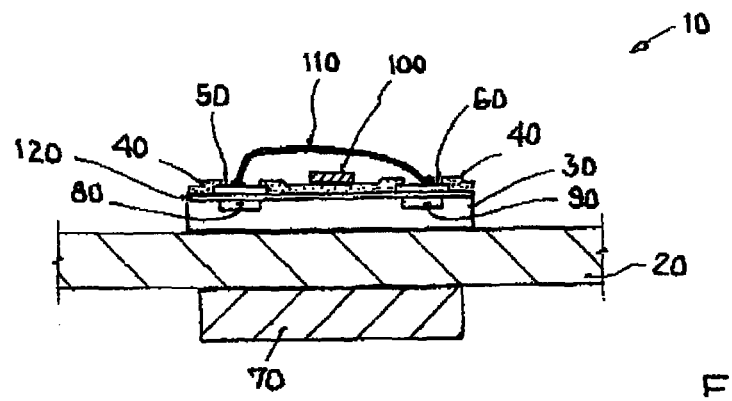
FIG. 1 is a diagrammatic cross section of an embodiment according to the invention of an integrated ammeter.

The image of FIG. 1 shows an embodiment of an integrated current sensor 10 according to the invention, having a semiconductor body 30 arranged on a metal substrate 20, with a passivation layer 40 embodied on the first surface and a first metal surface 50 and second metal surface 60 embodied in an opening of the passivation layer 40, and a magnetic field concentrator 70 embodied in a flat manner under the metal substrate 20. Furthermore, the integrated current sensor 10 has a first Hall-effect sensor 80 embodied in the semiconductor body 30 under the first metal surface 50 and a second Hall-effect sensor 90 embodied under the second metal surface 60. A first conductor 100 is embodied on the surface between the first metal surface 50 and the second metal surface 60. The first metal surface 50 and the second metal surface 60 are electrically connected to a ferromagnetic first wire 110 embodied above the passivation layer 40. The first conductor 90 is arranged at a predetermined distance under the first wire 110 and above the passivation layer 40. An integrated circuit—not shown—is embodied in the semiconductor body. Preferably, the two Hall-effect sensors 80, 90 are connected to the integrated circuit and are acted on with an operating current by means of the integrated circuit. Furthermore, the Hall voltages can be evaluated by means of the integrated circuit. As soon as the first conductor 100 is current-carrying, according to the flux direction of the current the direction of rotation of the magnetic field built up basically in an annular manner around the first conductor 100 is established. Under the metal substrate 20 the magnetic field lines of the first conductor 100 run virtually completely in the magnetic field concentrator 70 and hereby deviate substantially from the circular form. Above the conductor 100, a part of the field lines are bundled by the ferromagnetic wire 110. Due to the bundling, the flux density in the Hall-effect sensors 80, 90 is substantially increased and the sensitivity of the ammeter is increased.

Figure 2:
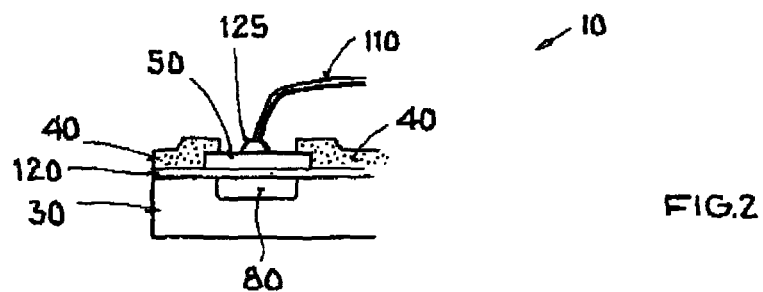
FIG. 2 is a sectional enlargement of a metal surface of the embodiment of FIG. 1.

The image of FIG. 2 shows a detailed front view of the structure of the semiconductor body in FIG. 1 in the region of the Hall-effect sensor 80. An insulating layer 120 is embodied between the metal surface 50 and the Hall-effect sensor 80. On the metal surface 50 the first wire 110 is connected by means of a bond 125. Because the distance of the end of the first wire 110 and the Hall-effect sensor 80 is only a few µm, virtually all of the magnetic field lines that run in the first wire 110 pass through the Hall-effect sensor 80. The effect is intensified by the magnetic field concentrator 70 located under the metal substrate 20.

Figure 3:
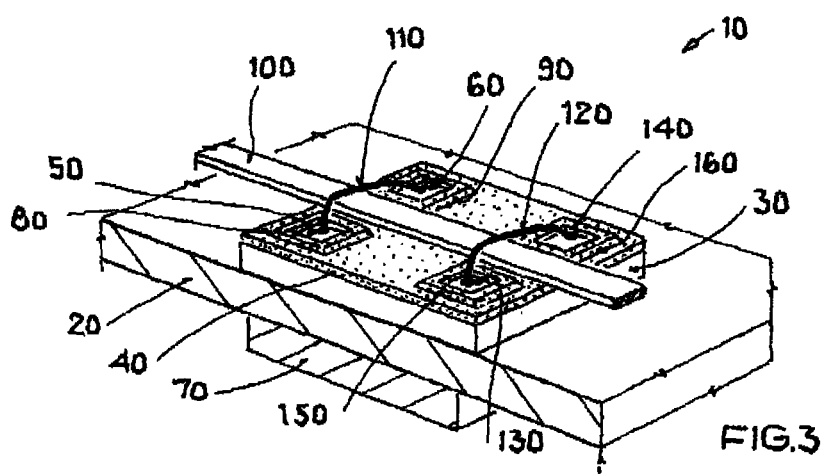
FIG. 3 is a perspective view of the embodiment of FIG. 1.

A second embodiment is shown in FIG. 3. Only the differences from the embodiment shown in the image of FIG. 1 are explained below. The conductor 50 is embodied as a solid wire with a rectangular cross section and is connected to the passivation layer 40 by adhesive force. The connection surfaces—not shown—of the first conductor 100 are embodied such that the first conductor 100 can be directly connected from outside even in a packaged state. A second ferromagnetic wire 120 is embodied spaced apart from the first wire 110. The ends of the second wire 120 are attached to a third metal surface 130 and to a fourth metal surface 140 by means of a bond method. A third Hall-effect sensor 150 is arranged under the third metal surface 130 and a fourth Hall-effect sensor 160 is arranged under the fourth metal surface 140. The magnetic field concentrator 70 is embodied in one piece such that the magnetic field concentrator 70 covers precisely the four Hall-effect sensors 80, 90, 150, 160.

Figure 4:
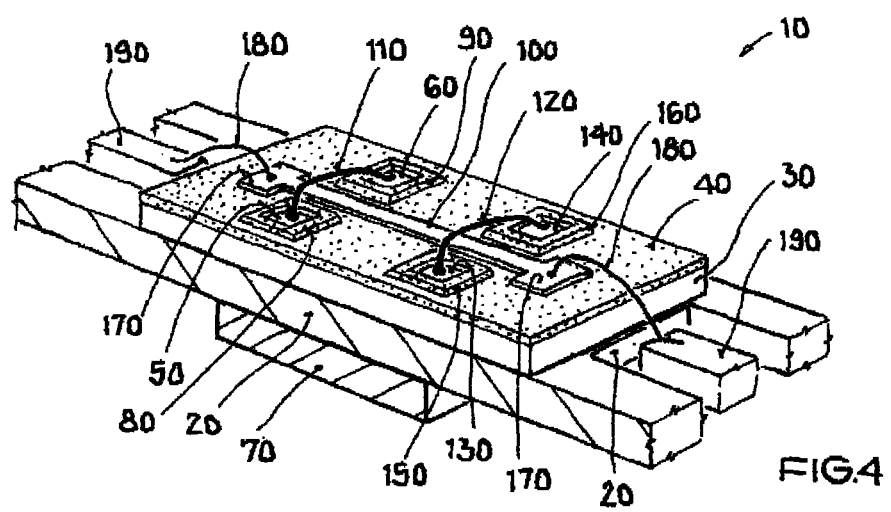
FIG. 4 is a perspective view of a further embodiment.

FIG. 4 shows an alternative embodiment of a conductor 50. Only the differences from the embodiment shown in the image of FIG. 3 are explained below. The conductor 100 has on both ends surfaces 170 of metal for connecting the conductor 50 by means of bond wires 180 to the metal substrate 20 embodied in individual strips 190.

Figure 5:
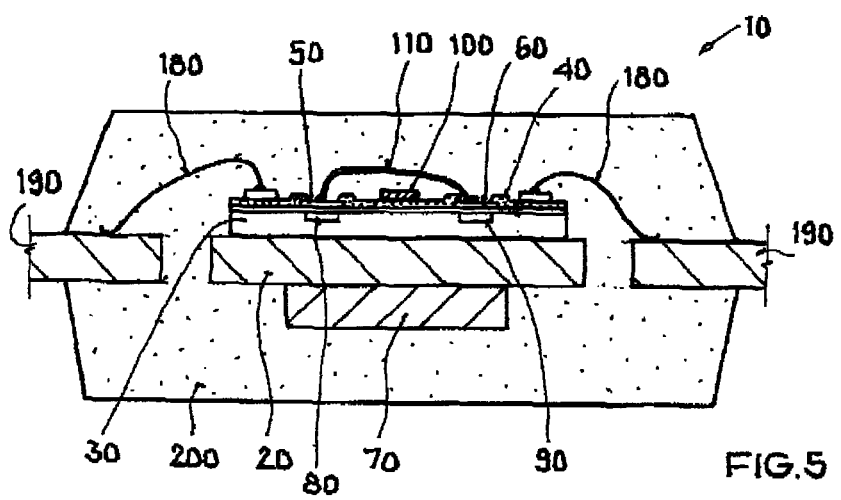
FIG. 5 is a diagrammatic representation of a first packaged embodiment.

FIG. 5 shows a diagrammatic cross-sectional view of the embodiment of FIG. 4. Only the differences from the embodiment shown in the image of FIG. 4 are explained below. The individual devices of the integrated current sensor 10 are embedded in a mold process into a standard IC housing 200. The housing 200 is preferably embodied of a plastic. In the packaged embodiment, the integrated current sensor 10 can be produced in a cost-effective and reliable manner. By means of an integrated circuit likewise embodied in the semiconductor body, the measured Hall voltages can be evaluated and static external magnetic fields can be calculated.

Figure 6:
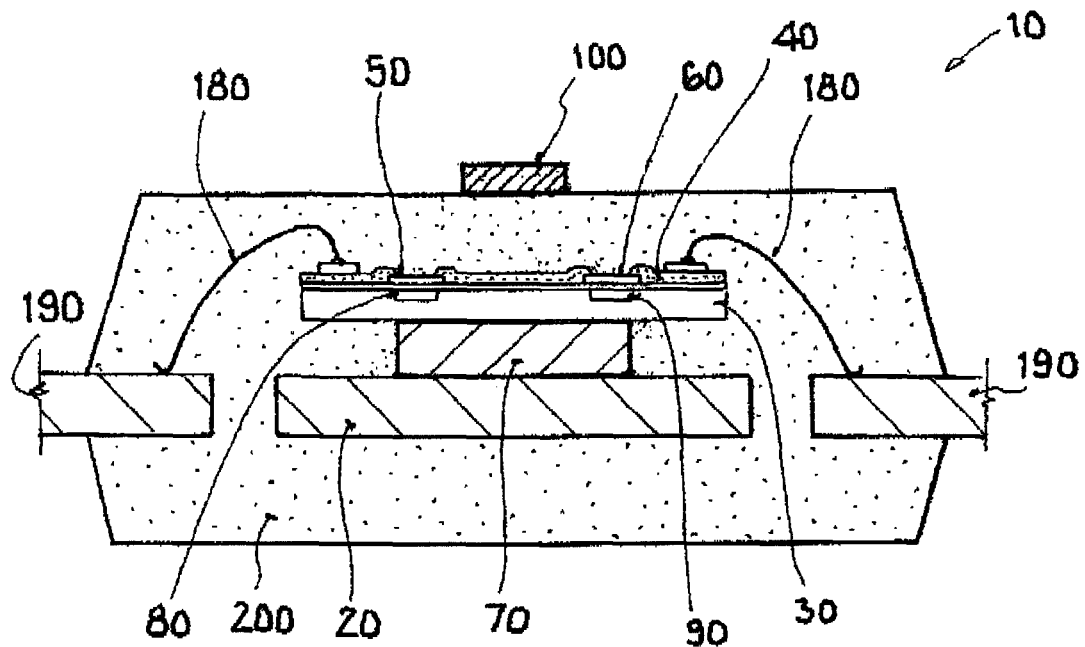
FIG. 6 is a diagrammatic representation of a second packaged embodiment.

FIG. 6 shows a diagrammatic cross-sectional view of a second embodiment. Only the differences from the embodiment shown in the image of FIG. 5 are explained below. The magnetic field concentrator 70 is arranged immediately below the semiconductor body 30. Neither a metal surface nor a ferromagnetic wire is embodied on the first surface of the semiconductor body 30 above the first Hall-effect sensor 80 and above the second Hall-effect sensor 90. However, the Hall-effect sensors are arranged above the edge of the magnetic field concentrator 70, precisely at the location at which the field lines of the conductor 100 exit in a bundled manner in the current-carrying case. It should be noted that the conductor 100 is located on the surface of the housing 200 above the first surface of the semiconductor body 30. In an embodiment that is not shown, the housing 200 has on the surface a cavity for the at least partial accommodation of the conductor 100. It is preferred hereby that the width of the cavity corresponds to the width of the conductor 100 and the depth of the cavity corresponds to the thickness of the conductor 100.

Since the magnetic field concentrator 70 is located directly under the semiconductor 30, the Hall-effect sensors are spaced apart only very slightly from the edge of the magnetic field concentrator 70. The sensitivity can be increased hereby. In an embodiment that is not shown, the metal substrate can be shaped according to the size of the magnetic field concentrator 70. In particular with a cavity adapted to the size of the magnetic field concentrator 70, a planar arrangement can be achieved between the strips 190 and the center part of the metal substrate 20.

Figure 7:
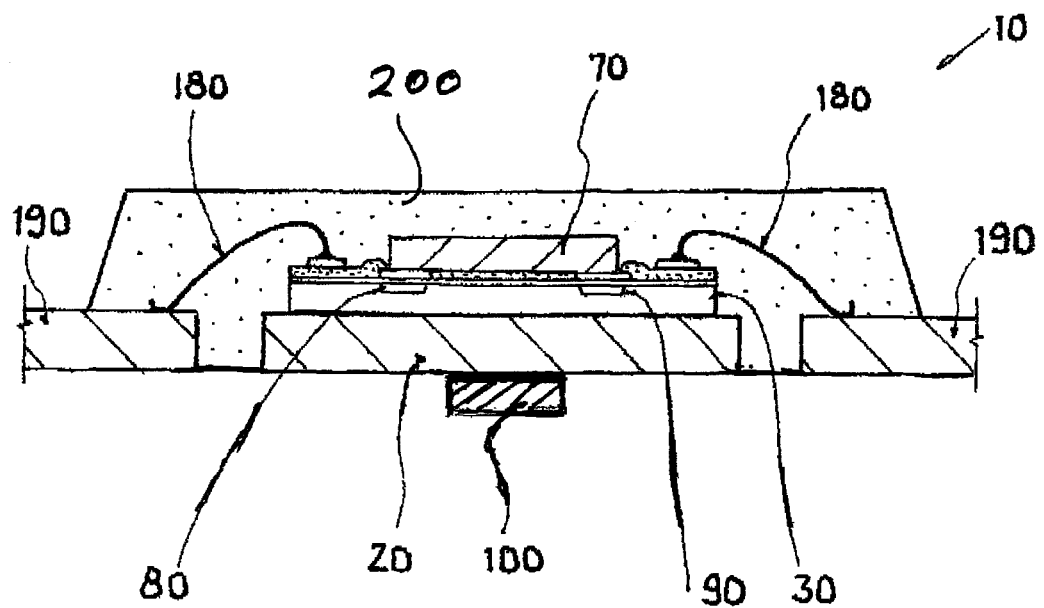
FIG. 7 is a diagrammatic representation of a third packaged embodiment.

FIG. 7 shows a diagrammatic cross-sectional view of a third embodiment. Only the differences from the embodiment shown in the image of FIG. 6 are explained below. The magnetic field concentrator 70 is arranged directly above the semiconductor body 30. The Hall-effect sensors are arranged directly under the edge of the magnetic field concentrator 70, precisely at the location at which the field lines of the current-carrying conductor 100 bundled in the magnetic field concentrator exit from the magnetic field concentrator 70 in a bundled manner. Because the magnetic field concentrator 70 is arranged immediately above the semiconductor body 30, the Hall-effect sensors have the smallest of the distances of all previous embodiments from the edge of the magnetic field concentrator 70. The flux density through the Hall-effect sensors is hereby particularly large. As a result, the sensitivity of the magnetic field sensor can be further increased. Furthermore, the housing 200 adjoins the underside of the substrate 20 and the conductor 100 is arranged on the underside of the substrate 20. Naturally, an insulating layer is embodied between the conductor 100 and the substrate 20. Since the substrate 20 is composed of a non-magnetic material, an influencing of the course of the magnetic field lines of the conductor 100 by the substrate 20 is negligible.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated current sensor comprising:
a semiconductor body arranged on a metal substrate, having a first surface with a passivation layer formed on the first surface;
a magnetic field concentrator formed in a flat manner under the semiconductor body;
a first Hall-effect sensor arranged under the passivation layer in the semiconductor body;
a second Hall-effect sensor arranged under the passivation layer in the semiconductor body; and
a first conductor arranged on the first surface separately from and overlapping with, the metal substrate between the first Hall-effect sensor and the second Hall-effect sensor,
wherein the magnetic field concentrator is arranged under the first Hall-effect sensor and under the second Hall-effect sensor and under the first conductor,
wherein the first Hall-effect sensor is arranged at least in part under a first metal surface in an opening of the passivation layer, and wherein the second Hall effect sensor is arranged at least in part under a second metal surface in an opening in the passivation layer,
wherein the first metal surface and the second metal surface are connected to a ferromagnetic first wire formed above the passivation layer, and
wherein the first conductor is guided through under the first wire at a predetermined distance.

2. The integrated current sensor according to claim 1, wherein the magnetic field concentrator is arranged under the metal substrate in a flat manner.

3. The integrated current sensor according to claim 1, wherein the first Hall-effect sensor and the second Hall-effect sensor are respectively arranged under an assigned metal surface.

4. The integrated current sensor according to claim 1, wherein the first conductor has a first connection surface at a first head end and a second connection surface at a second head end.

5. The integrated current sensor according to claim 1, wherein the first conductor is connected via a bond wire to the metal substrate.

6. The integrated current sensor according to claim 1, wherein the semiconductor body has an integrated circuit, and the integrated circuit is in an electrical active connection with at least one of the first and second Hall-effect sensors or the first conductor.

7. The integrated current sensor according to claim 1, wherein the magnetic field concentrator is connected to the metal substrate via an adhesive force.

8. The integrated current sensor according to claim 1, wherein the magnetic field concentrator is embodied in a one-part manner and covers at least a portion of the Hall-effect sensors.

9. The integrated current sensor according to claim 1, wherein the semiconductor body and the magnetic field concentrator are arranged in a single common housing.

10. An integrated current sensor comprising:
a semiconductor body arranged on a metal substrate, having a first surface with a passivation layer formed on the first surface;
a magnetic field concentrator formed in a flat manner under the semiconductor body;
a first Hall-effect sensor arranged under the passivation layer in the semiconductor body;
a second Hall-effect sensor arranged under the passivation layer in the semiconductor body; and
a first conductor arranged on the first surface separately from and overlapping with, the metal substrate between the first Hall-effect sensor and the second Hall-effect sensor,
wherein the magnetic field concentrator is arranged under the first Hall-effect sensor and under the second Hall-effect sensor and under the first conductor, and
wherein the first Hall-effect sensor is arranged at least in part under a first metal surface in an opening of the passivation layer, and wherein the second Hall effect sensor is arranged at least in part under a second metal surface in an opening in the passivation layer.

11. The integrated current sensor according to claim 10, further comprising a first wire that is a bond wire and that has a first bond on the first metal surface and a second bond on the second metal surface.

12. The integrated current sensor according to claim 10, wherein a third metal surface with a third Hall-effect sensor and a fourth metal surface with a fourth Hall-effect sensor are provided in additional openings of the passivation layer, wherein the third metal surface is connected to the fourth metal surface via a ferromagnetic wire, and wherein the first conductor is guided through under the ferromagnetic wire.

13. An integrated current sensor comprising:
a semiconductor body arranged on a metal substrate, having a first surface with a passivation layer formed on the first surface;

a magnetic field concentrator formed in a flat manner under the semiconductor body;

a first Hall-effect sensor arranged under the passivation layer in the semiconductor body;

a second Hall-effect sensor arranged under the passivation layer in the semiconductor body; and a first conductor arranged on the first surface between the first Hall-effect sensor and the second Hall-effect sensor, wherein the magnetic field concentrator is arranged under the first Hall-effect sensor and under the second Hall-effect sensor and under the first conductor, and wherein the first Hall-effect sensor is arranged at least in part under a first metal surface in an opening of the passivation layer, and wherein the second Hall effect sensor is arranged at least in part under a second metal surface in an opening in the passivation layer.

* * * * *